United States Patent
Klem et al.

(10) Patent No.: US 12,279,469 B2
(45) Date of Patent: Apr. 15, 2025

(54) COLLOIDAL QUANTUM DOT PHOTODETECTORS HAVING THIN ENCAPSULATION LAYERS THEREON AND METHODS OF FABRICATING THE SAME

(71) Applicant: SWIR Vision Systems Inc., Durham, NC (US)

(72) Inventors: Ethan J. D. Klem, Chapel Hill, NC (US); Christopher Gregory, Chapel Hill, NC (US); Jeffery Allan Hilton, Jr., Durham, NC (US); Michael Anthony Bond, Morrisville, NC (US); Katherine Elizabeth Violette, Raleigh, NC (US)

(73) Assignee: SWIR Vision Systems Inc., Scottsdale, AZ (US)

( * ) Notice: Subject to any disclaimer, the term of this patent is extended or adjusted under 35 U.S.C. 154(b) by 630 days.

(21) Appl. No.: 17/578,979

(22) Filed: Jan. 19, 2022

(65) Prior Publication Data

US 2022/0231244 A1   Jul. 21, 2022

Related U.S. Application Data

(60) Provisional application No. 63/138,977, filed on Jan. 19, 2021.

(51) Int. Cl.
*H10K 30/10* (2023.01)
*H10K 30/88* (2023.01)

(52) U.S. Cl.
CPC ............. *H10K 30/10* (2023.02); *H10K 30/88* (2023.02)

(58) Field of Classification Search
CPC ...... H10D 62/165; H10K 30/10; H10K 30/88; H01L 31/0203; H01L 31/09; H01L 31/035218; H01L 31/18; H10H 20/816; H10H 29/855
See application file for complete search history.

(56) References Cited

U.S. PATENT DOCUMENTS

| | | | |
|---|---|---|---|
| 8,729,528 B2 | 5/2014 | Klem et al. | |
| 8,742,398 B2 | 6/2014 | Klem et al. | |
| 2014/0225063 A1* | 8/2014 | Klem | H10K 30/10 257/14 |

(Continued)

FOREIGN PATENT DOCUMENTS

EP    3618115 A1    3/2020

OTHER PUBLICATIONS

Yun, et al: "Solution-processable integrated CMOS circuits based on colloidal CuInSe2 quantum dots", Nature Communications, vol. 11, No. 1, Oct. 19, 2020, XP093215565, UK; ISSN: 2041-1723, DOI: 10.1038/s41467-020-18932-5; Retrieved from the Internet: URL:https://www.nature.com/articles/s41467-020-18932-5>; pp. 4-8.

(Continued)

*Primary Examiner* — S M Sohel Imtiaz
(74) *Attorney, Agent, or Firm* — Stanek Lemon Crouse & Meeks, PA

(57) ABSTRACT

Colloidal quantum dot devices are provided including an integrated circuit; a colloidal quantum dot structure on the integrated circuit; and an encapsulation layer on the colloidal quantum dot structure, the encapsulation layer having a thickness from about 0.5 nm to about 500 nm.

18 Claims, 11 Drawing Sheets

(56) References Cited

U.S. PATENT DOCUMENTS

| | | | |
|---|---|---|---|
| 2017/0018669 A1* | 1/2017 | Williams | H01L 27/14601 |
| 2018/0005007 A1* | 1/2018 | Du | G06V 10/145 |
| 2018/0151764 A1* | 5/2018 | Auroux | H01L 27/14652 |
| 2018/0182812 A1* | 6/2018 | Heo | H10K 39/32 |
| 2018/0315898 A1* | 11/2018 | Chen | H01L 33/64 |
| 2021/0288195 A1 | 9/2021 | Klem et al. | |
| 2021/0375963 A1* | 12/2021 | Kuboi | H01L 27/14627 |
| 2022/0246875 A1* | 8/2022 | Saracco | H10K 30/88 |

OTHER PUBLICATIONS

Mandelli, et al: "Quantum Dot-Based Image Sensors for Cutting-Edge Commercial Multispectral Cameras" Invited Paper—Proc. of SPIE vol. 9933, Sep. 26, 2016, (7 pages); InVisage Technologies, XP060077656.

Yu, et al: "Recent progress on thin-film encapsulation technologies for organic electronic devices", Optics Communications, vol. 362, Aug. 25, 2015; pp. 43-49, XP029319257. Elsevier; Contents lists available at ScienceDirect.

Nguyen, et al: "Electrospray mechanism for quantum dot thin-film formation using electrohydrodynamic jet and light-emitting device application", Supplementary Information—School of Electronics and Display Engineering; Scientific Reports, vol. 10, No. 1, Jul. 6, 2020; XP093215574.

Extended European Search Report, EP22743080.8, Oct. 29, 2024, 15 pages.

* cited by examiner

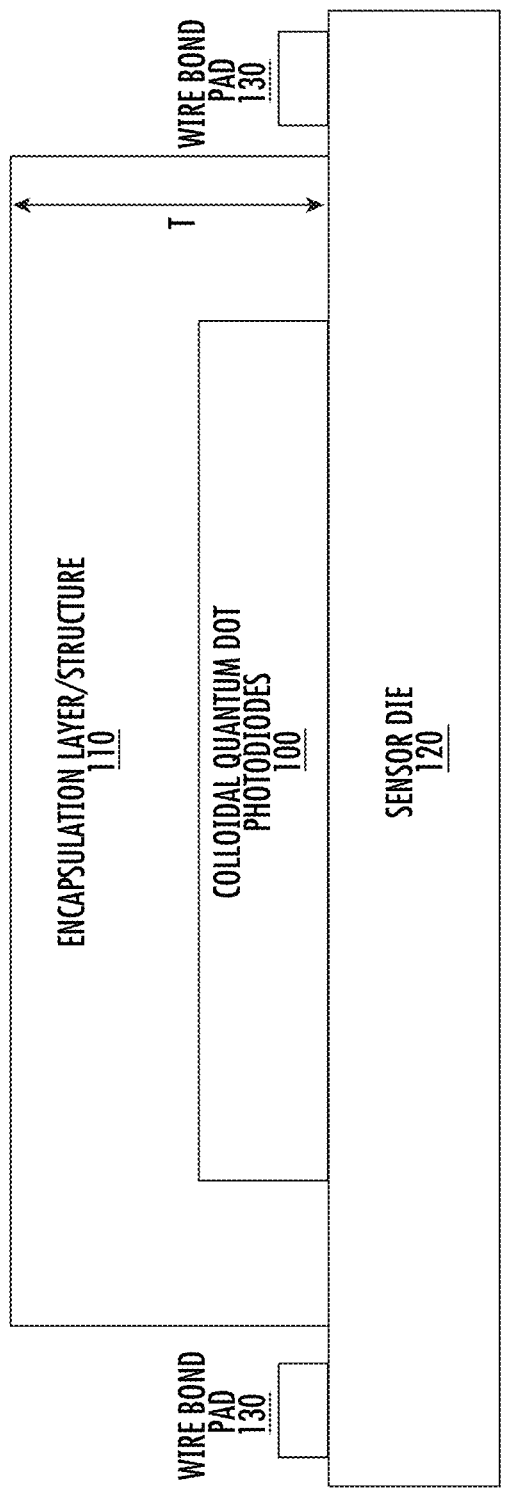

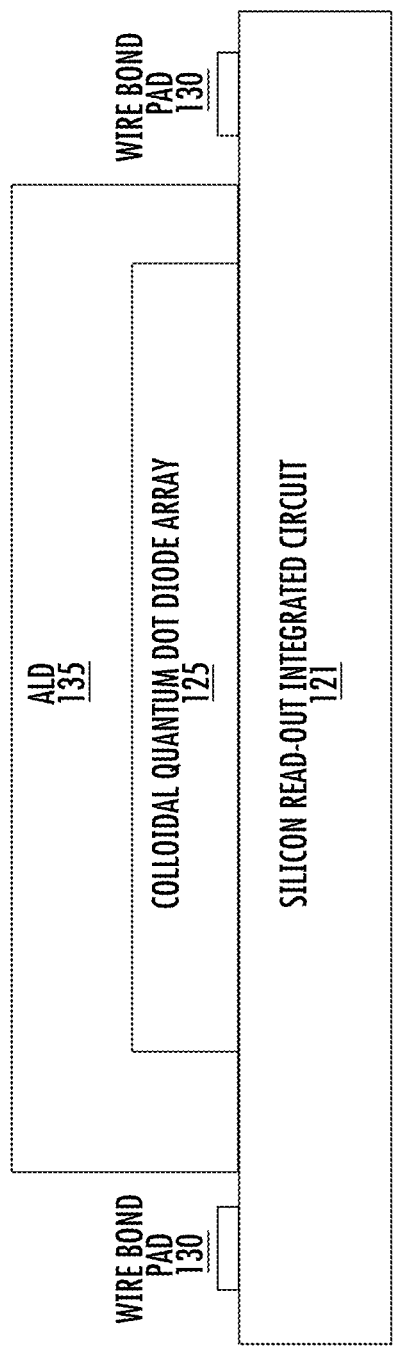

COLLOIDAL QUANTUM DOT PHOTODETECTORS HAVING THIN ENCAPSULATION LAYERS THEREON AND METHODS OF FABRICATING THE SAME

CLAIM OF PRIORITY

The present application claims the benefit of and priority to U.S. Patent Provisional Application Ser. No. 63/138,977, filed on Jan. 19, 2021, entitled COLLOIDAL QUANTUM DOT (CQD) PHOTODETECTORS HAVING THIN ENCAPSULATION LAYERS DEPOSITED THEREON AND METHODS OF FABRICATING THE SAME, the contents of which are hereby incorporated herein by reference as if set forth in its entirety.

FIELD

The present inventive concept relates generally to photodetectors, more particularly, to colloidal quantum dot photodetectors including thin encapsulation layers thereon and related methods.

BACKGROUND

Colloidal quantum dot photodetectors are photodetectors that use thin films composed of an ensemble of small particles of semiconductor material to absorb photons and detect light. Unlike some crystalline photodetector materials, such as silicon (Si), Gallium Arsenide (GaAs), and the like, colloidal quantum dot photodetectors commonly undergo device performance changes when exposed to air, moisture, or elevated temperature. These performance changes generally limit the operating conditions that colloidal quantum dot detectors can be deployed in and limit the usable lifetime of colloidal quantum dot containing sensors and systems. Thus, fabrication parameters for colloidal quantum dot photodetectors are being investigated to reduce, or possibly, eliminate air, moisture, and elevated temperature, for example, 40° C. to 125° C., sensitivity.

For example, some existing methods use visible and infrared (IR) transparent materials, for example, glass, sapphire, quartz, silicon and the like, bonded to colloidal quantum dot detectors. Typical bonding materials may include materials, such as polymer based adhesives, epoxies, and/or metal based soldering or welding. Adhesive and epoxy based solutions are generally not very hermetic, i.e. airtight, sealed, watertight, allowing some air and/or moisture to eventually reach the colloidal quantum dot detector. The transparent epoxies generally have low glass transition temperatures, which may reduce the likelihood of use in consumer electronics and automotive applications that need long lifetimes at elevated temperatures. While metal based solutions may be very hermetic and reliable, these solutions are generally not cost effective, and may be bulky for consumer applications. Finally, solutions which use a layer of glass-like material, for example, glass, sapphire, quartz, and the like, between the ambient environment and the photodetector can create undesirable optical interference artifacts, which may hinder, or possibly prevent, use in laser detection applications like those used for three dimensional (3D) depth sensing, Light Detection and Ranging (LIDAR), structured light, and the like. Improved methods and devices are desired.

SUMMARY

Some embodiments of the present inventive concept provide colloidal quantum dot devices including an integrated circuit; a colloidal quantum dot structure on the integrated circuit; and an encapsulation layer on the colloidal quantum dot structure, the encapsulation layer having a thickness from about 0.5 nm to about 500 nm.

In further embodiments of the present inventive concept, the colloidal quantum dot device may be an optoelectronic device including a first electrode; a first quantum dot layer on the first electrode, the first quantum dot layer including a plurality of quantum dots; and a second quantum dot layer including a plurality of quantum dots and being directly on the first quantum dot layer; and a second electrode on the second quantum dot layer.

In still further embodiments, an electron blocking layer is provided on the first electrode between the first electrode and the first quantum dot layer.

In some embodiments, the colloidal quantum dot device comprises an optoelectronic device including a first electrode; a quantum dot layer on the first electrode, the quantum dot layer including a plurality of quantum dots; a fullerene layer directly on the quantum dot layer; and a second electrode on the fullerene layer. The quantum dot layer and the fullerene layer form an electronic heterojunction.

In further embodiments, the encapsulation layer may be an atomic layer deposition (ALD) layer.

In still further embodiments, the ALD layer may be directly on the colloidal quantum dot structure. The colloidal quantum dot device may further include an epoxy layer on the ALD layer; and a glass layer on the epoxy layer.

In some embodiments, the device may further include an epoxy layer on the colloidal quantum dot structure; and a glass layer on the epoxy layer, wherein the ALD layer is on the glass layer.

In further embodiments, the colloidal quantum dot device may be one of a photodiode device and a photodetector detector device.

In still further embodiments, the colloidal quantum dot device may detect light with sensitivity spanning a spectral region ranging from about 250 nm to about 2400 nm.

In some embodiment, the encapsulation layer may include a plurality of alternating layers that together have the thickness of from about 0.5 nm to about 500 nm.

Further embodiments of the present inventive concept provide a die including an integrated circuit; a plurality of colloidal quantum dot devices on the integrated circuit; and an encapsulation layer on the plurality of colloidal quantum dot devices, the encapsulation layer having a thickness from about 0.5 nm to about 500 nm.

In still further embodiments, the die may be configured to be separated into a plurality of individual colloidal quantum dot devices.

In some embodiments, the encapsulation layer may be an ALD layer.

In further embodiments, the ALD layer may be directly on the plurality of colloidal quantum dot devices and the die may further include an epoxy layer on the ALD layer; and a glass layer on the epoxy layer.

In still further embodiments, the die may further include an epoxy layer on the plurality of colloidal quantum dot devices; and a glass layer on the epoxy layer, wherein the ALD layer is on the glass layer.

Some embodiments of the present inventive concept provide methods of fabricating a colloidal quantum dot device. The method includes providing an integrated circuit including a plurality of colloidal quantum dot structures thereon; forming an encapsulation layer on the plurality of colloidal quantum dot structures, the encapsulation layer having a thickness of from about 0.5 nm to about 500 nm;

and separating the plurality of colloidal quantum dot structures into individual colloidal quantum dot devices.

In further embodiments, the encapsulation layer may include one or more of $Al_2O_3$, $Zr_2O_3$, ZnO, InO, $SiO_2$, $Si_3N_4$, $Hf_2O_3$, $TiO_2$, $Ti_3N_4$, SiO, $Al_2N_3$ and $TaO_2$.

In still further embodiments, forming the encapsulation layer may include depositing the encapsulation layer using ALD.

In some embodiments, the encapsulation layer may be deposited at a temperature of from about 25° C. to about 150° C.

In further embodiments, the ALD layer may be formed directly on the plurality of colloidal quantum dot structures. The method may further include forming an epoxy layer on the ALD layer; and forming a glass layer on the epoxy layer.

In still further embodiments, the method may further include forming an epoxy layer on the plurality of colloidal quantum dot structures; and forming a glass layer on the epoxy layer, wherein the ALD layer is formed on the glass layer.

In some embodiments, the plurality of colloidal quantum dot structures may each include one of a photodiode device and a photodetector detector device.

In further embodiments, forming the encapsulation layer may include forming a plurality of alternating layers that together have the thickness of from about 0.5 nm to about 500 nm.

BRIEF DESCRIPTION OF THE DRAWINGS

FIG. 1A is a diagram illustrating a cross section of a die including a plurality of colloidal quantum dot photodiodes having an encapsulation layer thereon in accordance with some embodiments of the present inventive concept.

FIG. 1B is a more detailed diagram illustrating a cross-section of a die of FIG. 1A including example layers in accordance with some embodiments of the present inventive concept.

DETAILED DESCRIPTION

Figure 2:
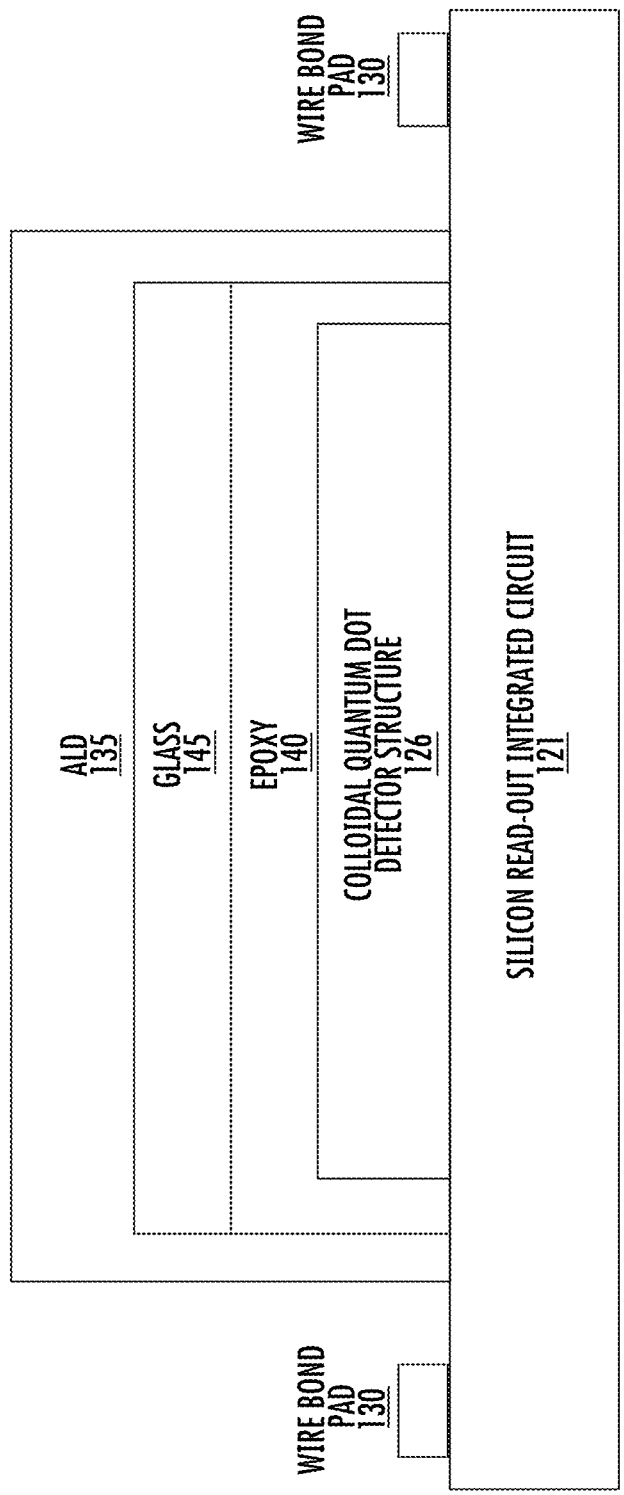
FIG. 2 is a diagram illustrating a cross-section of a die having an atomic layer deposition (ALD) encapsulation layer on glass and epoxy which in turn is on top of a colloidal quantum dot detector structure in accordance with some embodiments of the present inventive concept.

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As used herein, the term "optoelectronic device" generally refers to any device that acts as an optical-to-electrical transducer or an electrical-to-optical transducer. Accordingly, the term "optoelectronic device" may refer to, for example, a photovoltaic (PV) device (e.g., a solar cell), a photodetector, a thermovoltaic cell, or electroluminescent (EL) devices such as light-emitting diodes (LEDs) and laser diodes (LDs). In a general sense, EL devices operate in the reverse of PV and photodetector devices. Electrons and holes are injected into the semiconductor region from the respective electrodes under the influence of an applied bias voltage. One of the semiconductor layers is selected for its light-emitting properties rather than light-absorbing properties. Radiative recombination of the injected electrons and holes causes the light emission in this layer. Many of the same types of materials employed in PV and photodetector devices may likewise be employed in EL devices, although layer thicknesses and other parameters must be adapted to achieve the different goal of the EL device.

As used herein, the term "fullerene" refers to the buckminsterfullerene $C_{60}$ as well as other forms of molecular carbon, such as $C_{70}$, $C_{84}$, and similar cage-like carbon structures, and more generally may range from 20 to several hundreds of carbon atoms, i.e., $C_n$ where n is 20 or greater. The fullerene may be functionalized or chemically modified as desired for a specific purpose such as, for example, improving solubility or dispersability or modifying the electrical properties of the fullerene. The term "fullerene" may also refer to endohedral fullerenes wherein a non-carbon atom or atomic cluster is enclosed in the carbon cage. The term "fullerene" may also refer to fullerene derivatives. A few non-limiting examples of fullerene derivatives are [6,6]-phenyl-$C_{61}$-butyric acid methyl ester (PCBM) and phenyl-$C_{61}$-butyric acid cholesteryl ester (PCBCR). The term "fullerene" may also refer to blends of the previously mentioned forms of fullerenes.

As used herein, the term "quantum dot" or "QD" refers to a semiconductor nanocrystal material in which excitons are confined in all three spatial dimensions, as distinguished from quantum wires (quantum confinement in only two dimensions), quantum wells (quantum confinement in only one dimension), and bulk semiconductors (unconfined). Also, many optical, electrical and chemical properties of the quantum dot may be strongly dependent on its size, and hence such properties may be modified or tuned by controlling its size.

A quantum dot may generally be characterized as a particle, the shape of which may be spheroidal, ellipsoidal, or other shape. The "size" of the quantum dot may refer to a dimension characteristic of its shape or an approximation of its shape, and thus may be a diameter, a major axis, a predominant length, etc. The size of a quantum dot is on the order of nanometers, i.e., generally ranging from 1.0-1000 nm, but more typically ranging from 1.0-100 nm, 1.0-20 nm or 1-10 nm. In a plurality or ensemble of quantum dots, the quantum dots may be characterized as having an average size. The size distribution of a plurality of quantum dots may or may not be monodisperse. The quantum dot may have a core-shell configuration, in which the core and the surrounding shell may have distinct compositions. The quantum dot may also include ligands attached to its outer surface or may be functionalized with other chemical moieties for a specific purpose.

Plasma synthesis has evolved to be one of the most popular gas-phase approaches for the production of quantum dots, especially those with covalent bonds. For example, silicon (Si) and germanium (Ge) quantum dots have been synthesized by using nonthermal plasma. The size, shape, surface and composition of quantum dots can all be controlled in nonthermal plasma. Doping that seems quite challenging for quantum dots has also been realized in plasma synthesis. Quantum dots synthesized by plasma are usually in the form of powder, for which surface modification may be carried out. This can lead to excellent dispersion of quantum dots in either organic solvents or water, i.e., colloidal quantum dots. Embodiments of the present inventive concept use colloidal quantum dot films as discussed below.

For purposes of the present disclosure, the spectral ranges or bands of electromagnetic radiation are generally taken as follows, with the understanding that adjacent spectral ranges or bands may be considered to overlap with each other to some degree: ultra-violate (UV) radiation may be considered as falling within the range of about 10-400 nm, although in practical applications (above vacuum) the range is about 200-400 nm. Visible radiation may be considered as falling within the range of about 380-760 nm. Infrared (IR) radiation may be considered as falling within the range of about 750-100,000 nm. IR radiation may also be considered in terms of sub-ranges, examples of which are as follows. Short wave infrared (SWIR) radiation may be considered as falling within the range of about 1,000-3,000 nm. Medium wave infrared (MWIR) radiation may be considered as falling within the range of about 3,000-5,000 nm. Long range infrared (LWIR) radiation may be considered as falling within the range of about 8,000-12,000 nm.

Colloidal quantum dot photodetectors are discussed in, for example, commonly assigned U.S. patent application Ser. No. 17/199,971 filed on Mar. 12, 2021 entitled Colloidal Quantum Dot (CQD) Photodetectors and Related Devices; U.S. Pat. No. 8,729,528 entitled Quantum Dot-Fullerene Junction Optoelectronic Devices; and U.S. Pat. No. 8,742,398 entitled Quantum Dot-Fullerene Junction Based Photodetectors, the contents of which are hereby incorporated herein by reference as if set forth in their entirety. It will be understood that a colloidal quantum dot photodetector can be a photoconductor or a photodiode. A photoconductor is a conductor/resistor that changes in response to light. A photodiode is a diode that changes in response to light. Although embodiments of the present inventive concept are discussed primarily with respect to photodiodes, it will be understood that embodiments of the present inventive concept are not limited thereto.

Quantum dot photodiode/photodetector (QDP) technology is implemented to provide low-cost nanotechnology-enabled photodetectors. In some implementations, the photodetectors may be configured to efficiently detect light with sensitivity spanning a spectral region ranging from about 250-2400 nm. Thus, the photodetectors may be configured as a multispectral device capable of producing images from incident ultraviolet (UV), visible and/or infrared (IR) electromagnetic radiation. In some implementations, the spectral range of sensitivity may extend down to X-ray energies and/or up to IR wavelengths longer than 2400 nm. The photodetectors as taught herein are cost effective, scalable to large-area arrays, and applicable to flexible substrates.

As used herein, "quantum efficiency" (QE) refers to the ratio of incident photons to measured electrons, with the optimal efficiency being substantially 100% for a structure without internal amplification (i.e. gain). "Hermetic" refers to a device that is airtight, sealed and/or watertight.

"Dark current" refers to the electric current flowing in a photoelectric device when there is no incident illumination. In physics and in electronic engineering, dark current is the relatively small electric current that flows through photosensitive devices such as a photomultiplier tube, photodiode, or charge-coupled device even when no photons are entering the device. The dark current generally consists of the charges generated in the detector when no outside radiation is entering the detector. It can be referred to as reverse bias leakage current in non-optical devices and is generally present in all diodes. Physically, one source of dark current in diodes is the random thermal generation of excited electrons and holes within the depletion region of the device.

There is a fundamental trade-off for photodetector sensor materials between dark current and QE in direct relation to the thickness of the photodetector material. In particular, changing a thickness of the material, i.e. making the material thicker or thinner, improves one attribute at the expense of the other. Furthermore, unlike well-known crystalline photodetector materials, such as silicon (Si), Gallium Arsenide (GaAs), and the like, colloidal quantum dot photodetectors commonly undergo undesirable device performance changes when exposed to, for example, air. Thus, fabrication parameters for colloidal quantum dot photodetectors are being investigated to reduce, or possibly, eliminate air sensitivity. However, fabrication processes that result in air stable colloidal quantum dot devices rarely exhibit superior photodetector performance, for example, photo response, quantum efficiency, dark current, and the like.

For example, in an effort to combine superior photodetector performance with air stability, some existing methods use visible-IR transparent materials, for example, glass, sapphire, quartz, silicon and the like, bonded to colloidal quantum dot detectors. Typical bonding materials may include materials, such as polymer based adhesives, epoxies, and/or metal based soldering or welding. Adhesive and epoxy based solutions are generally not very hermetic (airtight, sealed, watertight) allowing some air and/or moisture to eventually reach the colloidal quantum dot detector. The transparent epoxies tend to have low glass transition temperatures, which may reduce the likelihood of use in consumer applications that need long lifetimes at elevated temperatures. While metal based solutions tend to be very hermetic and reliable, they are generally too expensive, and bulky for consumer applications. Finally, solutions which use a layer of glass-like material, for example, glass, sapphire, quartz, and the like, between the outside world and the photodetector can create undesirable optical interference artifacts, which may hinder, or possibly prevent, use in laser detection applications like those used for three dimensional (3D) depth sensing, Light Detection and Ranging (LIDAR), structured light, and the like.

Accordingly, to address some of the shortcomings discussed above with existing methods, embodiments of the present inventive concept provide devices and related methods of fabricating these devices having "thin" film encapsulation layers directly on a surface of the colloidal quantum dot photodetector. The "thin" film encapsulation layer may be formed on the surface of the colloidal quantum dot photodetector using, for example, atomic layer deposition (ALD) in some embodiments. It will be understood that although embodiments of the present inventive concept discuss the use of ALD, embodiments of the present inventive concept are not limited thereto. As used herein, a "thin" film refers to a film having a thickness of from about 0.5 to about several hundred nanometers. In some embodiments, the encapsulation layers may include various materials including, for example, $Al_2O_3$, $Zr_2O_3$, ZnO, InO, $SiO_2$, $Si_3N_4$, $Hf_2O_3$, $TiO_2$, $Ti_3N_4$, SiO, $Al_2N_3$, $TaO_2$, and the like. These materials are provided for example only and, therefore, embodiments of the present inventive concept are not limited thereto.

In embodiments of the present inventive concept utilizing deposition to form the encapsulation layer, the atom by atom nature of the deposition process, for example, ALD, provides a well-controlled, low defect density film on the surface of the colloidal quantum dot photodetector that enables low leak rates (i.e. very hermetic—sealed and watertight) even at film thicknesses of tens to hundreds of nanometers, reducing deposition time and cost. Furthermore, many ALD films can be deposited at colloidal quantum dot compatible temperatures, for example, temperatures of about 25° C. to about 150° C. Unlike many of the existing packaging methods discussed above, ALD films provided on a surface of the colloidal quantum dot film as discussed herein can be deposited and patterned at a wafer level, thus, leveraging the power of parallel processing. In other words, the ALD film may be deposited on the entire wafer and does not have to be done on the individual photodetector level. A wide variety of materials can be deposited via ALD. These materials may include, for example $Al_2O_3$, $Zr_2O_3$, ZnO, InO, $SiO_2$, $Si_3N_4$, $Hf_2O_3$, $TiO_2$, $Ti_3N_4$, SiO, $Al_2N_3$, $TaO_2$, and the like. The availability of this wide variety of films allows tuning of not only hermetic properties, but also optical properties, such as anti-reflective coatings.

Referring now to FIG. 1A, a cross section of a sensor die 120 including a plurality of colloidal quantum dot photodiodes 100 in accordance with some embodiments of the present inventive concept will be discussed. It will be understood that the sensor die 120 may be a single die or it may be a wafer containing an array of sensor dies without departing from the scope of the present inventive concept. In some embodiments, the wafer may be a partial wafer, for example, a quarter wafer, containing an array.

As illustrated in FIG. 1A, the device includes a sensor die 120 having a plurality of colloidal quantum dot diodes 100 on a surface thereof and an encapsulation layer/structure 110 on the plurality of colloidal quantum dot photodiodes 100. The sensor die 120 may be an integrated circuit 120, for example, a silicon read out Integrated Circuit (IC). As further illustrated, the device of FIG. 1A also includes a plurality of wire bond pads 130. It will be understood that the cross section of FIG. 1A is a simple diagram illustrating the "thin" encapsulation layer discussed in accordance with various embodiments of the present inventive concept and embodiments of the present inventive concept are not limited by FIG. 1A. In some embodiments, the colloidal quantum dot photodiodes 100 may be provided on the surface of ROIC die (or wafers) to produce a plurality of image sensors.

As discussed above, one advantage provided by methods in accordance with embodiments discussed herein is that an encapsulation layer 110 may be deposited on the entire die 120 (wafer) at once, rather than being formed on each photodetector individually. Thus, methods discussed herein provide a more efficient process by encapsulating the plurality of colloidal quantum dot photodiodes 100 at the wafer level, i.e. all at once before the individual photodetectors are separated from the wafer.

The encapsulation layer/structure 110 may include, for example, materials such as Al2O3, Zr2O3, ZnO, InO, SiO2, Si3N4, Hf2O3, TiO2, Ti3N4, SiO, Al2N3, TaO2, or the like and may be deposited on the surface of the die 120 and colloidal quantum dot detectors 100. The encapsulation layer/structure 110 may be deposited using an ALD method, however, embodiments of the present inventive concept are not limited thereto. The encapsulation layer may be deposited at temperatures from about 25° C. to about 150° C. Thus, these temperatures may be compatible with the colloidal quantum dot photodiode materials. The encapsulation layer/structure 110 may have a thickness T from about 0.5 nm to about 500 nm. The encapsulation layer/structure 110 may be a single material type or it may be a combination of multiple material types. For example, alternating layers of 1.0 nm thick $Al_2O_3$ and 1.0 nm thick $Zr_2O_3$ may be used to build up a total thickness of 100 nm by repeating the two-layer combination 10 times.

Referring to FIG. 1B, a cross-section of a device including an ALD encapsulation layer 135 is illustrated. As used herein, an "ALD layer" refers to an encapsulation layer that is formed using an ALD process. As illustrated in FIG. 1B, an array of colloidal quantum dot diodes/detectors 125 are provided on a silicon read out IC 121 and ALD layer/structure 135 is provided thereon. Wire bonding pads 130 are also provided in accordance with some embodiments. FIG. 1B is provided for example only and embodiments of the present inventive concept are not limited thereto.

It will be understood that in embodiments of the present inventive concept discussed at the wafer/die level, the plurality of colloidal quantum dot photodetectors may be separated into individual colloidal quantum dot photodetectors after formation of the encapsulation layer and completion of the device. Furthermore, although embodiments of the present inventive concept discuss the deposition at the die level, embodiments of the present inventive concept are not limited thereto. The deposition of the encapsulation layer may be done at the wafer, partial-wafer level or device level without departing from the scope of the present inventive concept.

Referring now to FIG. 2, a cross-section illustrating embodiments of an ALD-encapsulated colloidal quantum dot sensor will be discussed. As illustrated, the device of FIG. 2 includes an IC 121 having a colloidal quantum dot diode array 126 thereon. As further illustrated, a layer of epoxy 140 is on the diode array 126, a layer of glass 145 is on the epoxy layer 145 and an ALD layer 135 is on the array, epoxy and glass structure. Thus, FIG. 2 illustrates an ALD encapsulated colloidal quantum dot sensor having an ALD layer/structure deposited on a glass and epoxy structure. Embodiments illustrated in FIG. 2 are different from embodiments illustrated in FIGS. 1A and 1B where the ALD encapsulation is primarily serving to reduce the likelihood of, or possibly prevent, atmospheric ingress through the edge of the epoxy. In the structure illustrated in FIG. 2, the optical properties of the glass layer may provide performance advantages for specific sensing applications. For example, embodiments illustrated in FIG. 2 may be used for sensors built using glass with optical filtering properties.

As used herein, the "epoxy" layer may be provided by any of a class of adhesives, plastics, or other materials that are polymers of epoxides. The epoxy layer 140 of FIG. 2 may have a thickness of about 0.1 µm to about 150 µm. Similarly, the glass layer 145 may have a thickness of from about 0.1 mm to about 10 mm. As used herein, the "glass" layer may be provided by any of a class of inorganic materials that has a non-zero optical transmission for wavelengths of light utilized by the CQD detectors for a particular application. Examples of these window materials include soda-lime glass, borosilicate glass, sapphire, Si, and others.

Figure 3:
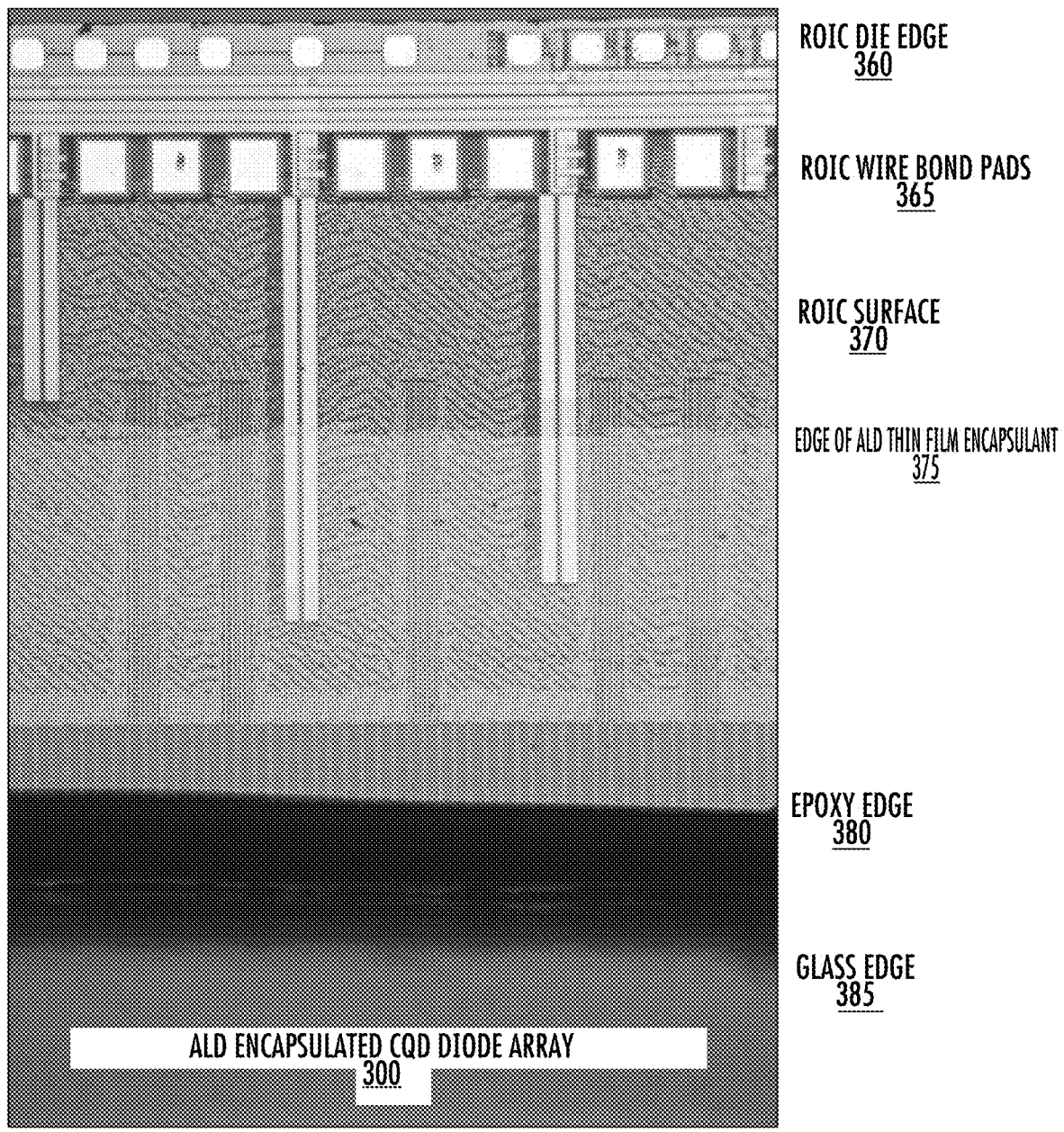
FIG. 3 is a diagram illustrating a microscope image of fabricated ALD encapsulation structures in accordance with some embodiments of the present inventive concept.

Referring now to FIG. 3, a microscope image of a fabricated ALD encapsulation structure 300 will be discussed. The microscope image in FIG. 3 illustrates an optical microscope image of a colloidal quantum dot image sensor fabricated using an ALD encapsulation layer illustrated in FIG. 2. As illustrated, the microscope image of the ALD encapsulated colloidal quantum dot device array of FIG. 3 illustrates a read out integrated circuit (ROIC) die edge 360, ROIC wire bond pads 365, a ROIC surface 370, an edge of the ALD thin film encapsulant 375, an epoxy edge 380 and a glass edge 385. This ALD-encapsulated sensor 300 was thermally stress tested in air (ambient) for hundreds of hours and showed none of the performance degradation exhibited by sensors stress tested without the thin encapsulation layer discussed in accordance with some embodiments of the present inventive concept.

Figure 4:
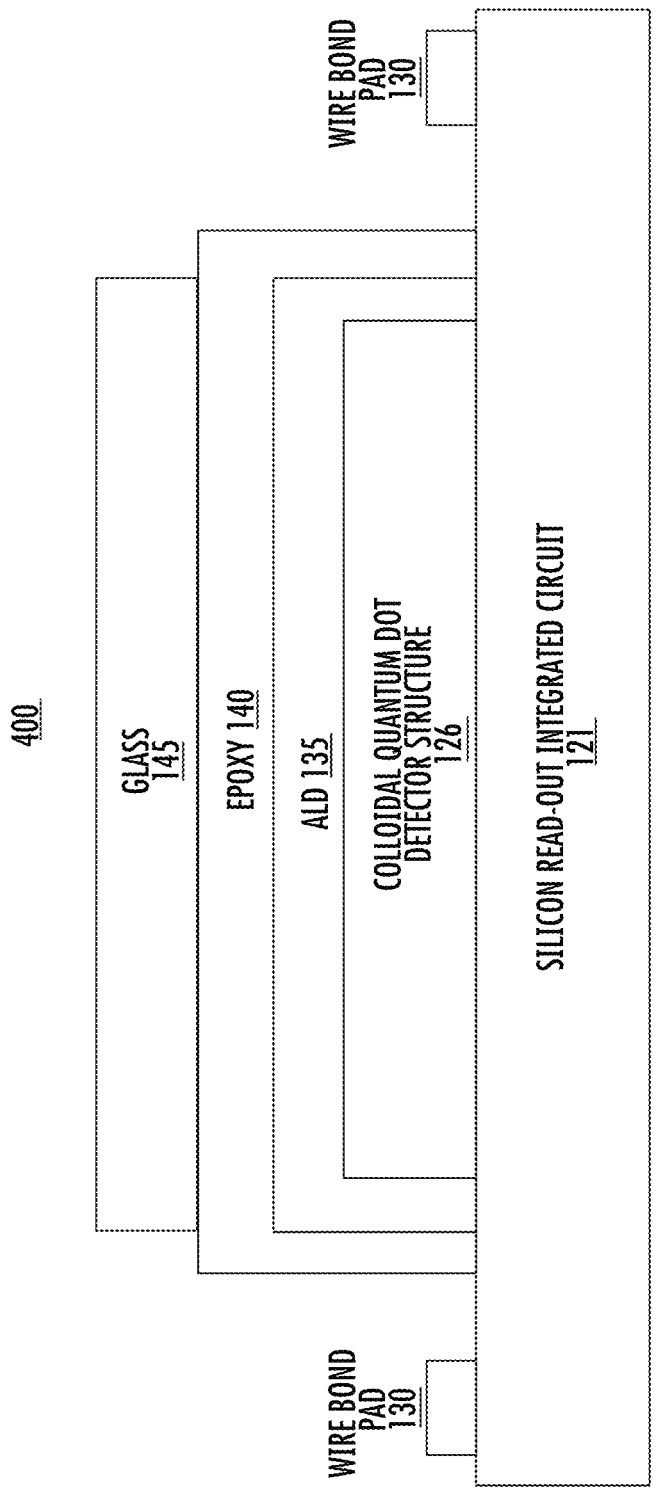
FIG. 4 is a diagram illustrating a cross section of a die having an atomic layer deposition (ALD) encapsulation layer under epoxy and Glass in accordance with some embodiments of the present inventive concept.

Referring now to FIG. 4, a cross-section illustrating embodiments of an ALD-encapsulated colloidal quantum dot sensor 400 will be discussed. As illustrated in FIG. 4 the ALD encapsulated colloidal quantum dot sensor 400 includes an ALD layer/structure 135 deposited directly on the colloidal quantum dot sensor structure/array 126, along with a coating of an epoxy or other organic material 140, followed by an (optional) glass layer 145. Embodiments illustrated in FIG. 4 are different from embodiments illustrated in FIGS. 1A and 1B and FIG. 2 discussed above in the arrangement of layers. The structure illustrated in FIG. 4 can be used, for example, where there are manufacturing or performance advantages for sensors produced with this structure for example, this particular may provide the mechanical robustness of the glass with the conformability of the ALD.

The epoxy layer (or organic layer) 140 of FIG. 4 may have a thickness of about 0.1 µm to about 150 µm. Similarly, the glass layer 145 may have a thickness of from about 0.1 mm to about 10 mm.

Figure 5:
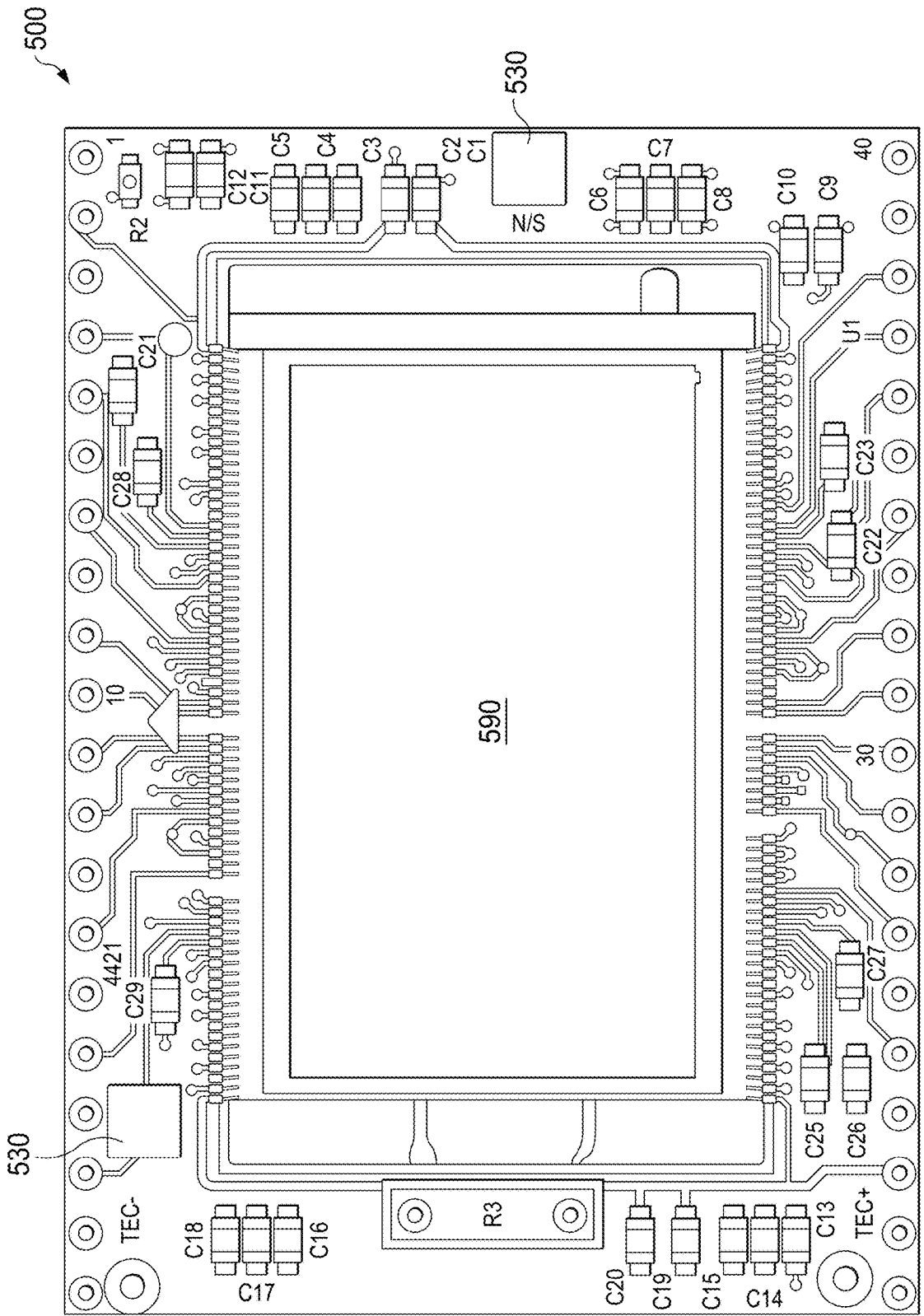
FIG. 5 is a diagram illustrating a photograph of a colloidal quantum dot image sensor fabricated with an ALD encapsulation structure in accordance with some embodiments of the present inventive concept.

Referring now FIG. 5, a photographic image 500 taken of a colloidal quantum dot image sensor fabricated with an ALD structure similar to the structure illustrated in FIG. 4 will be discussed. As illustrated, in the center of the image one can see a rectangular 1920×1080 format, 2.1 megapixel image sensor 590 fabricated with colloidal quantum dot photodiodes, an ALD layer, an epoxy layer, and a glass layer in accordance with some embodiments of the present inventive concept. This colloidal quantum dot image sensor is shown with wire bonds 530 connecting the sensor bond pads to a circuit board. It will be understood that the sensor of FIG. 5 is provided for example only and embodiments of the present inventive concept are not limited thereby. For example, sensors in accordance with embodiments of the present inventive concept do not have to be rectangular.

Figure 6A:
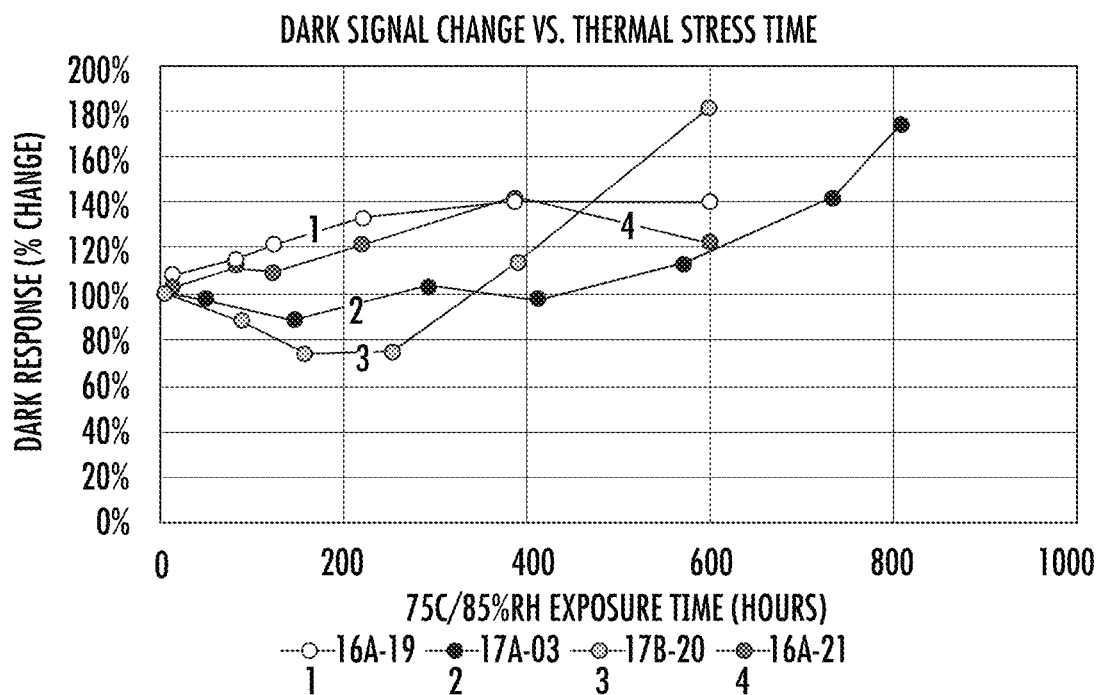
FIG. 6A is a graph illustrating a change in sensor dark signal as a function of high temperature and humidity stress time for sensors fabricated without a thin film ALD encapsulation structure in accordance with embodiments of the present inventive concept.
Figure 6B:
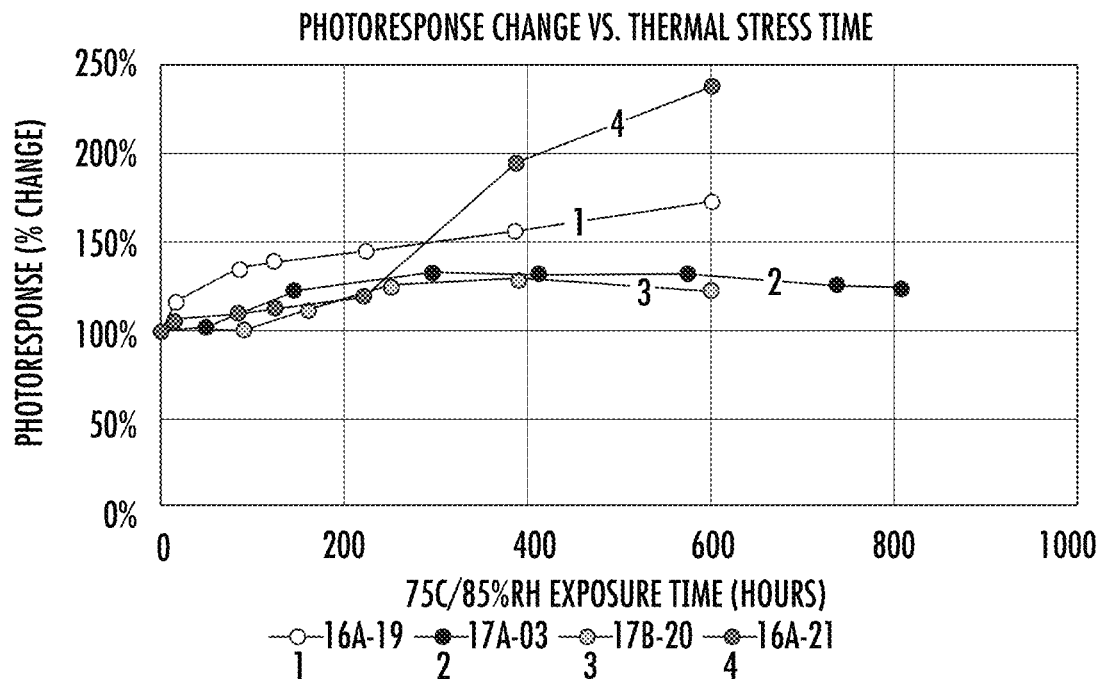
FIG. 6B is a graph illustrating a change in sensor photoresponse signal as a function of high temperature and humidity stress time for sensors fabricated without a thin film ALD encapsulation structure in accordance with some embodiments of the present inventive concept.

Referring now to FIG. 6A and FIG. 6B, graphs illustrating performance characteristics of devices that do not include a thin encapsulation layer in accordance with some embodiments of the present inventive concept will be discussed. In particular, FIG. 6A illustrates change in sensor dark signal as a function of thermal stress time for sensors fabricated without a thin film encapsulation structure. FIG. 6B illustrates change in sensor photoresponse signal as a function of thermal stress time for sensors fabricated without a thin film encapsulation layer. Thus, FIGS. 6A and 6B illustrate plots of sensor dark and illuminated signals as a function of thermal and humidity stress chamber exposure time. FIGS. 6A and 6B illustrate data from four different sensors labeled 1, 2, 3 and 4. The plotted data in FIG. 6A shows the mean dark signal of the pixel array on the y-axis and the time that the sensors are exposed to 75° C. and 85% relative humidity conditions in a thermal stress chamber. This dark signal is normalized to the time zero data point collected after sensor fabrication is complete. It then shows measured dark signal for periodic time periods after.

Similarly, the plotted data in FIG. 6B shows the mean photoresponse of the pixel array to a spatially flat 1550 nm wavelength illumination for the same sensors 1, 2, 3 and 4 as shown in FIG. 6A. The instability of the sensor output over time illustrates the need for improvements to produce a long-lifetime sensor with stable performance.

Figure 7A:
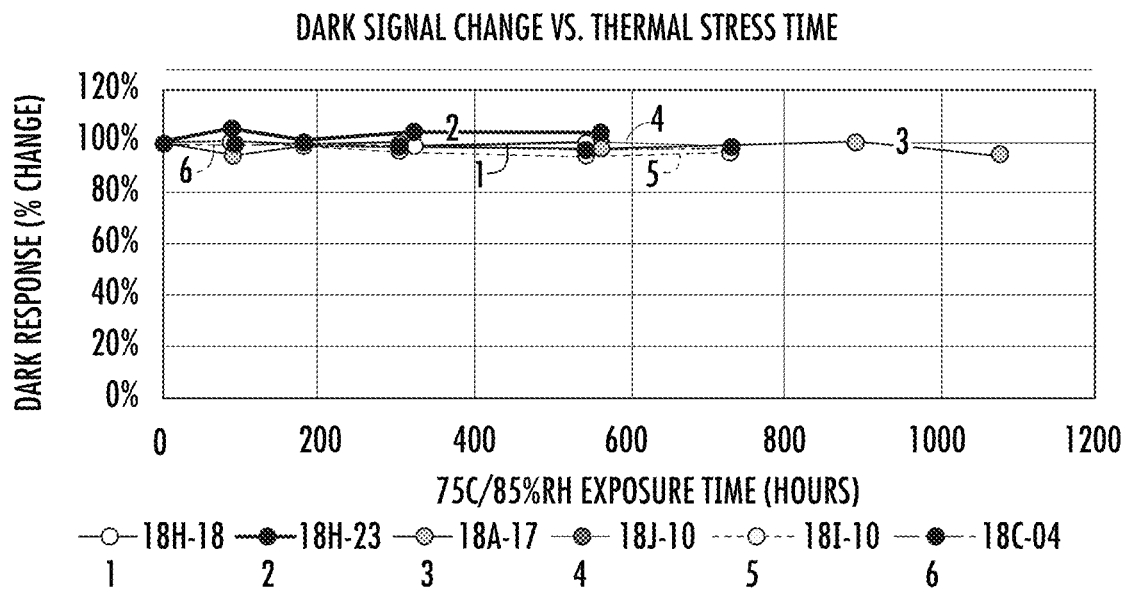
FIG. 7A is a graph illustrating the change in sensor dark signal as a function of high temperature and humidity stress time for sensors fabricated with an ALD film encapsulation structure in accordance with some embodiments of the present inventive concept.
Figure 7B:
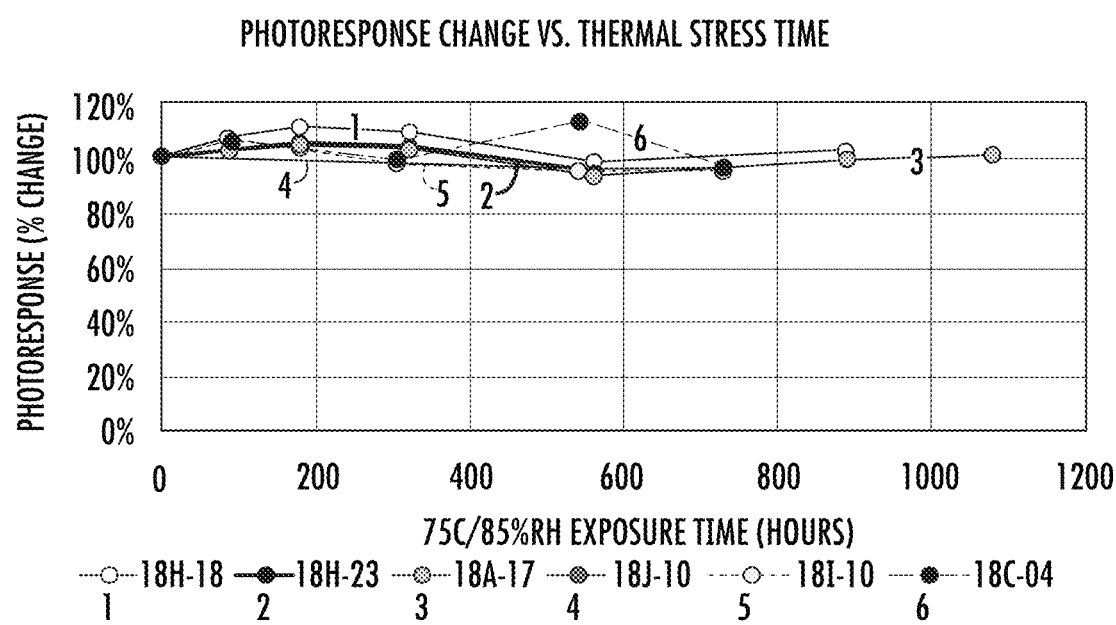
FIG. 7B is a graph illustrating the change in sensor photoresponse signal as a function of high temperature and humidity stress time for sensors fabricated with an ALD film encapsulation structure in accordance with some embodiments of the present inventive concept.

Referring now to FIGS. 7A and 7B, graphs illustrating performance characteristics of devices that include a thin encapsulation layer in accordance with some embodiments of the present inventive concept will be discussed. In particular, FIG. 7A illustrates change in sensor dark signal as a function of thermal stress time for sensors fabricated with a thin film encapsulation structure. FIG. 7B illustrates change in sensor photoresponse signal as a function of thermal stress time for sensors fabricated with a thin film encapsulation layer. FIGS. 7A and 7B, illustrate the thermal stability of six different 1920×1080 format, 2.1 megapixel image sensors 1, 2, 3, 4, 5, and 6 fabricated using the thin encapsulation structure in accordance with embodiments discussed herein. In particular, the plotted data of FIG. 7A illustrates the mean dark signal of each pixel array normalized to the time zero data point. It shows measured data collected at different times as the sensors 1, 2, 3, 4, 5 and 6 were exposed to 75° C., 85% relative humidity conditions in a stress test chamber. FIG. 7B shows the mean photoresponse for the same sensors 1, 2, 3, 4, 5 and 6 as a function of stress test chamber exposure time. These plots illustrate the benefits to the thermal stability of colloidal quantum dot sensors fabricated with the encapsulation structures in accordance with embodiments discussed herein.

Figure 8A:
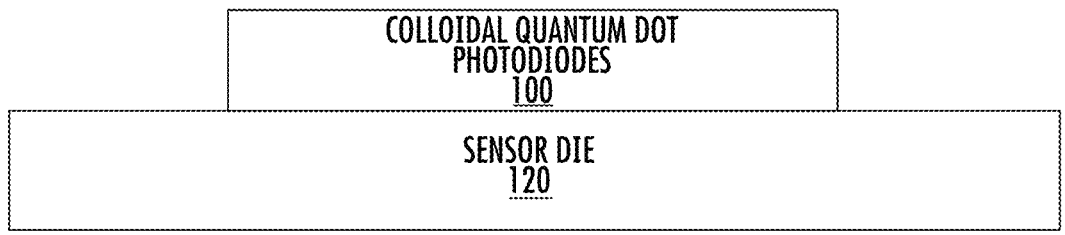
FIGS. 8A through 8C are cross sections illustrating processing steps in the fabrication of colloidal quantum dot sensor in accordance with various embodiments of the present inventive concept.

Referring now to the cross-sections of FIGS. 8A through 8C, processing steps in the fabrication of colloidal quantum dot devices in accordance with some embodiments will be discussed. Referring first to FIG. 8A, a sensor die 120 including a plurality of colloidal quantum dot photodiodes 100 in accordance with some embodiments of the present inventive concept will be discussed is provided. It will be understood that the sensor die 120 may be a single die or it may be a wafer containing an array of sensor dies without departing from the scope of the present inventive concept. In some embodiments, the wafer may be a partial wafer, for example, a quarter wafer, containing an array of sensor dies. The sensor die 120 may be an integrated circuit 120, for example, a silicon read out Integrated Circuit (IC) in some embodiments.

Figure 8B:
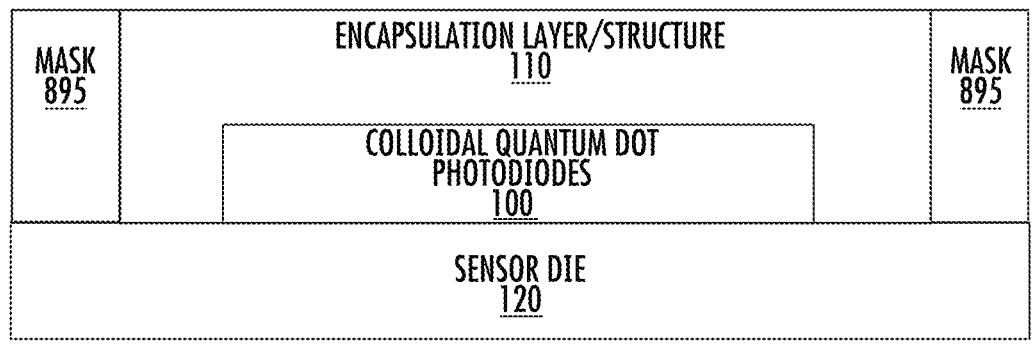

As illustrated in FIG. 8B, a mask 895 is formed on the surface of the device of FIG. 8A to define the encapsulation layer/structure. The mask can be any typical mask material, such as SiO2, Si3N4, gold (Au), chromium (Cr), boron and the like. The encapsulation layer/structure 110 is formed according to the mask 895. In some embodiments, the encapsulation layer/Structure is deposited using ALD to form an ALD layer on the colloidal quantum dot devices 100 according to the mask. The atom by atom nature of the ALD deposition process provides a well-controlled, low defect density film on the surface of the colloidal quantum dot photodetector 100 that enables low leak rates (i.e. very hermetic—sealed and watertight) even at film thicknesses of tens to hundreds of nanometers, reducing deposition time and cost.

The ALD layer may be deposited temperatures of about 25° C. to about 150° C., which are compatible with colloidal quantum dot materials. ALD films provided on a surface of the colloidal quantum dot film as discussed herein can be deposited and patterned at a wafer level, thus, leveraging the power of parallel processing. In other words, the ALD film may be deposited on the entire wafer and does not have to be done on the individual photodetector level. A wide variety of materials can be deposited via ALD. These materials may include, for example Al2O3, Zr2O3, ZnO, InO, SiO2, Si3N4, Hf2O3, TiO2, Ti3N4, SiO, Al2N3, TaO2, and the like. The availability of this wide variety of films allows tuning of not only hermetic properties, but also optical properties, such as anti-reflective coatings.

Figure 9:
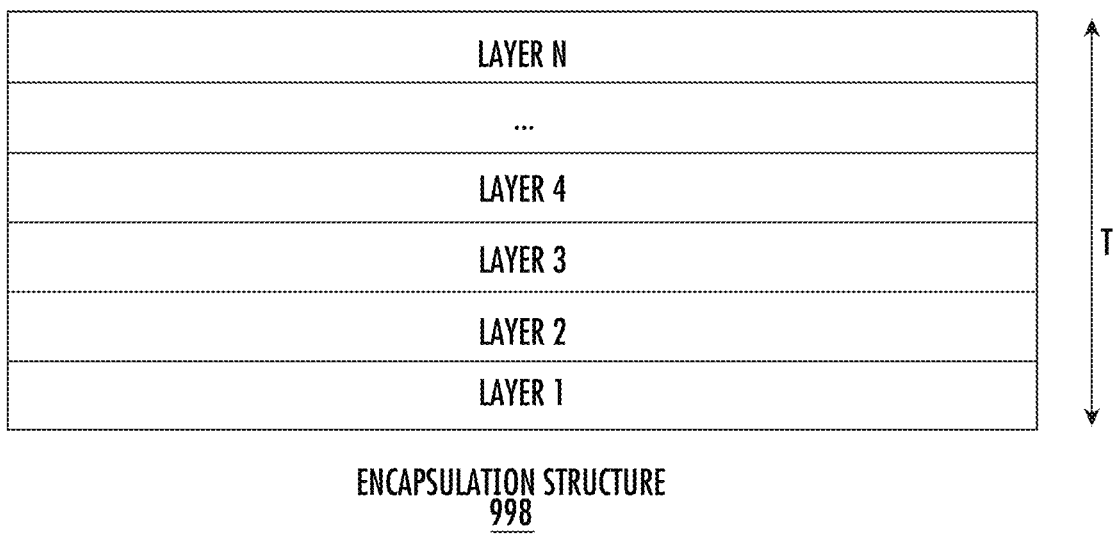
FIG. 9 is a diagram illustrating a multilayer encapsulation layer in accordance with some embodiments of the present inventive concept.

The encapsulation layer/structure 110 may be deposited to a thickness T from about 0.5 nm to about 500 nm. The encapsulation layer/structure 110 may be a single material type or it may be a combination of multiple material types. As illustrated in, for example, FIG. 9 of the present application, in some embodiments, the encapsulation layer/structure 998 may include a plurality of alternating layers 1 through N, where N can be any reasonable integer. For example, the encapsulation structure 998 may include alternating layers of 1.0 nm thick $Al_2O_3$ and 1.0 nm thick $Zr_2O_3$ may be used to build up a total thickness T, for example, of 100 nm by repeating the two-layer combination 10 times. Thus, N would be 10 in this embodiment. This is provided as an example only and embodiments of the present inventive concept is not limited thereby.

Figure 8C:
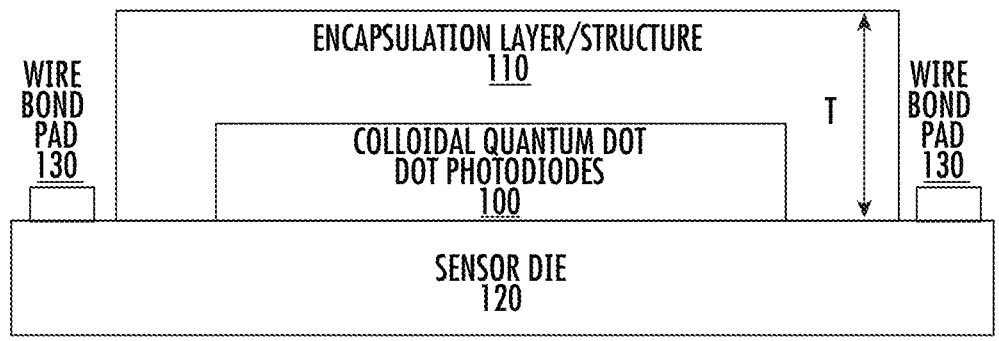

Once the encapsulation layer/structure is complete, the mask 895 may be removed and the device may be completed including, for example, wire bond pads 130 as illustrated in FIG. 8C. It will be understood that FIGS. 8A through 8C are provided as an example of embodiments including only and ALD layer, similar to FIG. 1B. However, as discussed above, embodiments may include and epoxy layer as well as a glass layer as shown in FIGS. 2 and 4 above without departing from the scope of the present inventive concept.

Embodiments of the present inventive concept are discussed herein with respect to one or more "colloidal quantum dot devices" on an integrated circuit, wafer or die. These devices may be any colloidal quantum dot devices, optoelectronic devices, photodetectors, sensors and the like. However, in some embodiments, the colloidal quantum dot devices are provided by devices discussed in, for example, U.S. Pat. No. 8,729,528 entitled Quantum Dot-Fullerene Junction Optoelectronic Devices; and U.S. Pat. No. 8,742, 398 entitled Quantum Dot-Fullerene Junction Based Photodetectors, the contents of which were incorporated herein by reference above.

Figure 10:
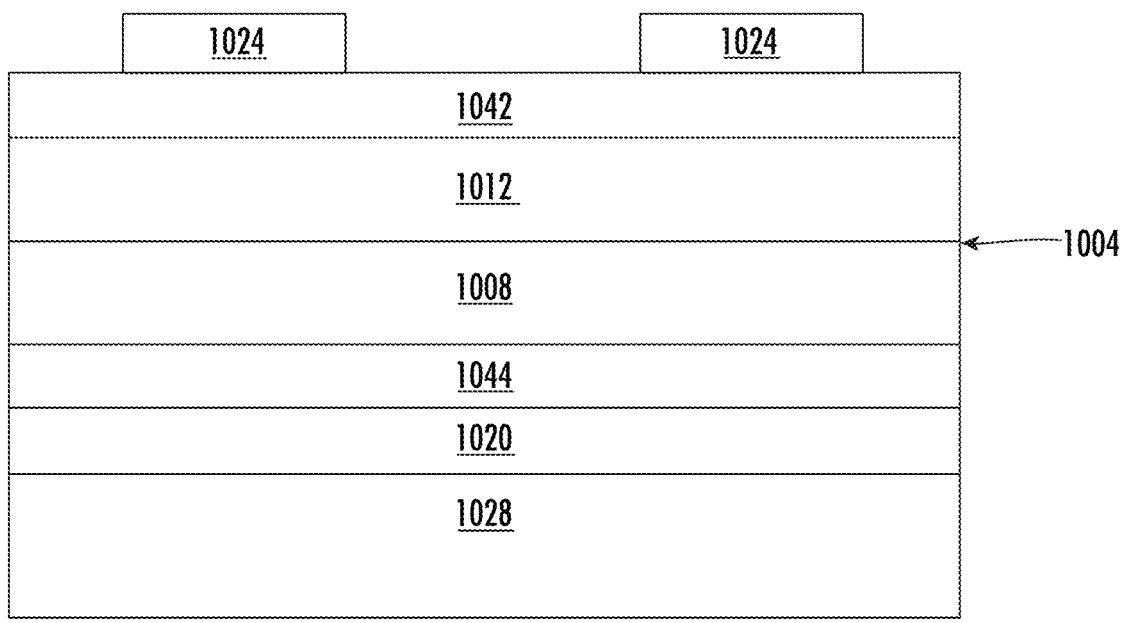
FIG. 10 is a diagram illustrating a cross-section of an example colloidal quantum dot device in accordance with some embodiments of the present inventive concept.

A cross section of an example colloidal quantum dot device 1000 for use in accordance with some embodiments of the present inventive concept will now be discussed with respect to FIG. 10. As illustrated in FIG. 10, the device includes a substrate 1028, an electrode 1020 on the substrate 1028, an optional electron blocking layer 1044, a first quantum dot (QD) layer 1008, a second QD layer 1012 or a fullerene layer 1012 and optional hole blocking layer 1042 and at least one electrode 1024. It will be understood that the cross-section of the device 1000 illustrated in FIG. 10 is provided for example only and embodiments of the present inventive concept are not limited thereto. As discussed, both the electron blocking layer and the hole blocking layer may be omitted without departing from the scope of the present inventive concept.

In some embodiments, the device 1000 is an optoelectronic device that operates as a image sensor although persons skilled in the art will appreciate that the optoelectronic device 1000 may be adapted to function as another type of optoelectronic device without departing from the scope of the present inventive concept. In embodiments where layer 1012 is a fullerene layer, the optoelectronic device 1000 may be any optoelectronic device based on an electronic heterojunction 1004 formed by a quantum dot (QD) layer 1008 directly interfaced with a fullerene layer 1012. The QD layer 1008 is photosensitive, forming excitons in response to absorption of light. The fullerene layer 1012 is also photosensitive, forming excitons in response to absorption of light. In the case of a PV device or other type of light-absorbing device, the QD layer 1008 may be disposed on an electrode 1020 (serving as an anode), the fullerene layer 1012 is directly disposed on the QD layer 1008, and an electrode 1024 (serving as a cathode) may be disposed on the fullerene layer 1012. In a typical implementation, the electrode 1024 is intended to transmit incident light and thus is composed of a transparent material. In these embodiments, the electrode 1024 may be referred to as the front electrode (receiving incident light) and the other electrode 1020 may be referred to as the back electrode.

It will be understood that in some embodiments layer 1012 may be a second quantum dot layer and in some embodiments the layer 1012 may be a fullerene layer, different from a quantum dot layer. As used herein, a QD layer 1008/1012, includes a plurality of quantum dots (QDs). The QD layers 1008/1012 may have a thickness ranging from about 5.0 nm to about 5.0 µm. In the present context, thickness is defined in the vertical direction from the perspective of FIG. 10, with the understanding that no limitation is placed on the particular orientation of the optoelectronic device 1000 relative to any particular frame of reference. In implementations typical to the present teachings, the QDs are composed of inorganic semiconductor materials. In one particularly advantageous yet non-limiting example, the QDs are lead sulfide (PbS) crystals or particles. More generally, QDs may be selected from various Group II-VI, Group I-III-VI, Group III-V, Group IV, Group IV-VI, and Group V-VI materials. Examples include, but are not limited to, Group II-VI materials such as ZnS, ZnSe, ZnTe, ZnO, CdS, CdSe, CdTe, CdO, HgS, HgSe, HgTe, HgO, MgS, MgSe, Mgte, MgO, CaS, CaSe, CaTe, CaO, SrS, SrSe, SrTe, SrO, BaS, BaSe, BaTe, and BaO; Group I-III-VI materials such as $CuInS_2$, $Cu(In,Ga))S_2$, $CuInSe_2$, and $Cu(In,GA)Se_2$; Group III-V materials such as AlN, AlP, AlAs, ALsB, GaN, Gap, GaAs, GaSb, InN, InP, InAs, and InSb; Group IV materials such as Si, Ge, and C; Group IV-VI materials such as GeSe, PbS, PbSe, PbTe, PbO, SnSe, SnTe, and SnS, and Group V-VI materials such as $Sb_2Te_3$, $Bi_2Te_3$, and $Bi_2Se_3$. Transition metal compounds such as the oxides, sulfides, and phosphides of Fe, Ni, and Cu may be applicable. Examples of QDs further encompass binary, ternary, quaternary, etc. alloys or compounds that include the foregoing species (e.g., SiGe, InGaAs, InGaN, InGaAsP, AlInGaP, etc.). Other QDs may include other types of semiconducting materials (e.g., certain organic and polymeric materials). For a QD having a core-shell structure, the shell may be composed of one of the foregoing species or other species, and the respective compositions of the core and the shell may be different—e.g., a core-shell composition might be CdSe—ZnS.

As appreciated by persons skilled in the art, the composition selected for the QDs may be based on a desired property such as band gap energy or wavelength sensitivity. As examples, QDs such as PbS, PbSe, PbTe, InAs, InP, InSb, InGaAsP, Si, Ge or SiGe may be selected for IR sensitivity, while QDs such axe CdS, CdSe or CdTe may be selected for visible sensitivity, and QDs such as ZnS or ZnSe for UV sensitivity. PbS and other IR-sensitive QDs are particularly useful in photovoltaic devices as a large portion of solar energy available for conversion by optoelectronic devices lies in the IR region. Blue-, UV-, and near-IR-absorbing (or emitting) QDs may also be selected. Moreover, the size of the QDs may be selected to absorb or emit a desired range of electromagnetic radiation. Generally for a given species of QD below a critical size, a smaller size is more sensitive to shorter (bluer) wavelengths and a larger size is more sensitive to longer (redder) wavelengths. Furthermore, the optoelectronic behavior of the QDs may be customized in dependence on their shape or their size distribution in the QD Layer 108. Additionally, the QD layer 1008/1012 may include QDs of two or more different species (compositions) and/or two or more different specific sizes. This is useful when it is desired to extend the range of properties, behavior or performance of the QD layer 1008/1012. For example, a mixture of QDs in the QD layer 1008/1012 may be selected so that the QD layer 1008/1012 has enhanced responsiveness to different bands of electromagnetic spectra (e.g., visible and IR radiation, visible and UV radiation, etc.). Alternatively or additionally, more than one distinct QD layer 1008/1012 may be provided, each having a different composition or size of QDs. Two or more QD layers may form a part of a corresponding number of separate QD-fullerene junctions within the optoelectronic device 1000 having a fullerene layer therein.

The QDs may be formed by various known techniques such as, for example, colloidal synthesis, plasma synthesis, vapor deposition, epitaxial growth, and nanolithography. The size, size distribution, shape, surface chemistry or other attributes of the QDs may be engineered or tuned to have desired properties (e.g., photon absorption and/or emission) by any suitable technique now known or later developed. The QD layer 1008/1012 may be formed on an underlying layer (e.g., the electrode 1020 or an intervening layer) by any suitable method, particularly solution-based methods such as various known coating and printing methods, or doctor blading. In some embodiments, the QDs are provided in a solution of an organic carrier solvent such as anisole, octane, hexane, toluene, butylamine, water, etc., with or without a matrix or host material, and are deposited to a desired thickness by spin-coating. Excess solvent may thereafter be eliminated by evaporation, vacuum or heat treatment. After formation, the QD layer 1008/1012 may or may not include residual solvent. The as-deposited QD layer 1008/1012 may be characterized as including a plurality, ensemble or array of QDs. The QDs may be closely packed, yet more or less free-standing, without inclusion of a matrix material. Without a matrix material, the QD layer 1008/1012 may be stabilized by London or Van der Waals forces. Alternatively, the QDs may be dispersed to a desired density or concentration in a matrix material, which may be composed of a polymer, sol-gel or other material that can easily form a film on the intended underlying surface. Generally, the matrix material selected is chosen to enhance the optical-to-electrical or electrical-to-optical conversion or other performance parameters of the QDs and of the overall optoelectronic device 100 contemplated. One example of such a matrix material is a semiconducting polymer such as poly-3-hexylthiophene. Alternatively the QDs may be stabilized by treating them as described below to render the film less soluble.

The electrode 1024 may be any material that is electrically conductive and, when the electrode 1024 is intended to receive incident light, optically transparent. In some embodiments, an electrically conductive material is generally one which would be considered acceptable for use as an electrode or contact for passing current in a commercial- or industrial-grade circuit, i.e., with an acceptable low level of resistive loss. An optically transparent material is generally one which passes a sufficient amount of incident light through its thickness to irradiate the QDs of the QD layer 1008/1012, i.e., without significant reflection and absorption of photons. As one non-limiting example, a transparent material may be one that permits at least 50% of incident electromagnetic radiation (of a desired wavelength or range of wavelengths) to be transmitted though the thickness of the material. Additionally, the material of the electrode 1020 should be one which provides a surface suitable for deposition of the QDs, and which generally facilitates fabrication of the optoelectronic device 1000 in a reliable, low-cost manner.

Examples of the electrode 1024 include, but are not limited to, transparent conductive oxides (TCOs), transparent metals, and transparent conductive polymers. TCOs may include, for example, tin oxide (TO), indium tin oxide (ITO), zinc oxide (ZnO), zinc indium oxide (ZIO), zinc indium tin oxide (ZITO), gallium indium oxide (GIO), and further alloys or derivatives of the foregoing. Tin oxide may also be doped with fluorine (F). ZnO may be doped with a Group III element such as gallium (Ga), and/or aluminum (Al), and thus may be more generally stoichiometrically expressed as $Zn_xAl_yGa_z$ where $x+y+z=1$, $0\leq x\leq 1$, $0\leq y\leq 1$, and $0\leq z\leq 1$. Other metal oxides may be suitable, as well as non-oxide thin-film semiconductors. In the case of metals, various metals (e.g., silver, gold, platinum, titanium, lithium, aluminum, magnesium, copper, nickel, and others), metal-inclusive alloys (including multi-layers or two or more different metals, with or without an adhesion-promoting layer such as tungsten), or metal-inclusive compounds may be employed as the electrode 1024, so long as the metallic electrode 1024 is thin enough to be transparent, i.e., has a "transparent thickness." If the optoelectronic device 1000 is desired to be sensitive in the IR range, then the electrode 1024 should be sufficiently transparent to IR wavelengths. The electrode 1024 is typically fabricated by a vacuum deposition technique such as, for example, chemical vapor deposition (CVD), metalorganic CVD (MOCVD), radio-frequency (RE) or magnetron sputtering, molecular beam epitaxy (MBE), ion beam epitaxy, laser MBE, pulsed laser deposition (PLD), or the like. Depending on the composition, other deposition techniques such as thermal evaporation or sublimation may be suitable. A conductive polymer if sufficiently transparent may alternatively be employed as the electrode 1024, and may be deposited by a solution-based process, spin coating, dip coating, spray coating, etc. One non-limiting example of a transparent conductive polymer is poly(3,4-ethylenedioxythiophene:polystryenesulfonate (PEDOT:PSS) and its chemical relatives and derivatives. A layer of conductive carbon nanotubes (CNTs) or nano-sheets (e.g. graphene) may be employed as the electrode 1024, and may or may not include a matrix material surrounding the CNTs or nano-sheets. Electrode materials may also be combined to form a composite electrode 1024. One example is the use of a TCO, such as ITO, combined with a conductive polymer to improve the interface quality, such as PEDOT:PSS. In another embodiment conductor 1024 does not need to be transparent and may be selected from metals, metal-inclusive alloys, or metal-inclusive compounds. One or both electrodes 1020 or 1024 should be transparent.

The electrode(s) 1020 may also be provided pursuant to the description above regarding the electrode 1024. In typical implementations of the optoelectronic device, the electrode 1020 does not need to be transparent and thus its composition is typically selected from metals, metal-inclusive alloys, or metal-inclusive compounds. The electrode 1020 may be selected based on its work function or its utility as an ohmic contact.

As discussed above, in some embodiments, it may be advantageous to provide an electron blocking layer 1044 on the electrode 1020. In some embodiments, the electron blocking layer may be fabricated such that it only partially covers the electrode 1020. An electron blocking layer 1044 providing partial coverage may be termed a discontinuous layer or film. A discontinuous electron blocking layer 1044 may provide the best combination of exciton and/or electron blocking capability while allowing efficient transport of holes to the electrode 1020. This partial coverage may be formed by known patterning techniques, or by depositing the film under appropriate conditions such that it results in only partial coverage. Examples of patterning techniques include, but are not limited to, the use of masks, deposition by ink-jet printing, etc. In some implementations, the discontinuous electron blocking layer 1044 has a configuration in which islands or regions of the electron blocking material are separated or surrounded by areas that do not contain the electron blocking material (i.e., the absence of electron blocking material at the planar level of the electron blocking layer 1044). In some embodiments, the discontinuous electron blocking layer 1044 has a configuration in which areas not containing the electron blocking material are surrounded by the electron blocking material. Hence, in a discontinuous electron blocking layer 1044 the majority of the planar area of the electron blocking layer 1044 may or may not be occupied by the electron blocking material. When a discontinuous electron blocking layer 1044 is provided as a pattern, the pattern may be regular or irregular. Examples of patterns include, but are not limited to, a series of stripes, an array of polygons, an array of circles or dots, etc.

Depending on its composition and the properties of the semiconductor layer with which it is interfaced, a hole blocking layer 1042 and/or an electron blocking layer 1044 such as those noted above may also serve as an exciton blocking layer to confine photogenerated excitons to the region of the heterojunction where they need to be dissociated and keep them away from the electrode/semiconductor interfaces. Anode-side and/or cathode-side exciton blocking layers may also be provided in addition to the hole blocking layer 1042 and/or the electron blocking layer 1044. As appreciated by persons skilled in the art, the composition of the exciton blocking layer may be dictated by whether it is positioned adjacent to an anode (e.g., the electrode 1020) or a cathode (e.g., the electrode 1024), so that the exciton blocking layer does not impair hole transport or electron transport in the relevant direction. It is also appreciated that hole blocking layers, electron blocking layers, and exciton blocking layers may be doped with other compounds as needed for a variety of purposes such as enhancing mobility or stabilizing their structures. Moreover, these types of layers may also be desirable as protective layers to protect as-deposited underlying layers during the fabrication process. Persons in the art will appreciate the applicability of chemical derivatives or relatives of the foregoing examples of materials, as well as similarly behaving alternatives of such materials that may be utilized as the hole blocking layer, the electron blocking layer, and the exciton blocking layer.

As discussed briefly above, some embodiments of the present inventive concept provide colloidal quantum dot based photodetectors that are hermetically encapsulated with thin encapsulation layers, for example, ALD thin film(s). As discussed, due to the availability of various materials for the encapsulation layer, the hermetically encapsulated ALD film(s) may be tuned to act as anti-reflective (AR) coatings. The thin film encapsulation method for colloidal quantum dot photodetectors discussed herein provides advantages over conventional methods, such as infrared sensor packaging approaches, including reduction in packaging cost, size, and weight. The low cost, size, weight encapsulation method for colloidal quantum dot photodetectors may be used for industrial, mobile, and automotive sensing applications.

Embodiments of the present inventive concept are described herein with reference to cross-section illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present inventive concept.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Furthermore, although various layers, sections and regions of the photodetector may be discussed as being p-type and/or n-type, it is understood by those of skill in the art that in many devices these conductivity types may be switched without effecting the functionality of the device. If an element, region or layer is referred to as "n-type" this means that the element, layer or region has been doped to a certain concentration with n-type dopants, for example, Si, Germanium (Ge) or Oxygen. If an element region or layer is referred to "p-type" this means that the element, region or layer has been doped with p-type dopants, for example, magnesium (Mg), Beryllium (Be), Zinc (Zn), Calcium (Ca) or Carbon (C). In some embodiments, an element, region or layer may be discussed as "$p^+$" or "$n^+$," which refers to a p-type or n-type element, region or layer having a higher doping concentration than the other p-type or n-type elements, regions or layers in the device. Finally, regions may be discussed as being epitaxial regions, implanted regions and the like. Although these regions may include the same material, the layer resulting from the various methods of formation may produce regions with different properties. In other words, an epitaxial grown region may have different properties than an implanted or deposited region of the same material.

In the drawings and specification, there have been disclosed exemplary embodiments of the inventive concept. However, many variations and modifications can be made to these embodiments without substantially departing from the principles of the present inventive concept. Accordingly, although specific terms are used, they are used in a generic and descriptive sense only and not for purposes of limitation, the scope of the inventive concept being defined by the following claims.

What is claimed is:

1. A colloidal quantum dot device comprising:
   an integrated circuit;
   a colloidal quantum dot structure on the integrated circuit;
   an encapsulation layer on the colloidal quantum dot structure, the encapsulation layer comprising an atomic layer deposition (ALD) layer, wherein the ALD layer is directly on the colloidal quantum dot structure;
   an epoxy layer on the ALD layer; and
   a glass layer on the epoxy layer.

2. The colloidal quantum dot device of claim 1 comprising an optoelectronic device, the optoelectronic device comprising:
   a first electrode;
   a first quantum dot layer on the first electrode, the first quantum dot layer including a plurality of quantum dots;
   a second quantum dot layer including a plurality of quantum dots and being directly on the first quantum dot layer; and
   a second electrode on the second quantum dot layer.

3. The colloidal quantum dot device of claim 2, further comprising an electron blocking layer on the first electrode between the first electrode and the first quantum dot layer.

4. The colloidal quantum dot device of claim 1 comprising an optoelectronic device, the optoelectronic device comprising:
   a first electrode;
   a quantum dot layer on the first electrode, the quantum dot layer including a plurality of quantum dots;
   a fullerene layer directly on the quantum dot layer; and
   a second electrode on the fullerene layer wherein the quantum dot layer and the fullerene layer form an electronic heterojunction.

5. The colloidal quantum dot device of claim 1, wherein the colloidal quantum dot device comprises one of a photodiode device and a photodetector device.

6. The colloidal quantum dot device of claim 1, where the colloidal quantum dot device detects light with sensitivity spanning a spectral region ranging from about 250 nm to about 2400 nm.

7. The colloidal quantum dot device of claim 1, wherein the encapsulation layer comprises a plurality of alternating layers that together have the thickness of from about 0.5 nm to about 500 nm.

8. A colloidal quantum dot device comprising:
an integrated circuit;
a colloidal quantum dot structure on the integrated circuit;
an encapsulation layer on the colloidal quantum dot structure, the encapsulation layer comprising an ALD layer;
an epoxy layer on the colloidal quantum dot structure; and
a glass layer on the epoxy layer, wherein the ALD layer is on the glass layer.

9. A die comprising:
an integrated circuit;
a plurality of colloidal quantum dot devices on the integrated circuit; and
an encapsulation layer on the plurality of colloidal quantum dot devices, the encapsulation layer comprising an ALD layer, wherein the ALD layer is directly on the plurality of colloidal quantum dot devices;
an epoxy layer on the ALD layer; and
a glass layer on the epoxy layer.

10. The die of claim 9, wherein the plurality of colloidal quantum dot devices comprise a plurality of optoelectronic devices, each of the optoelectronic devices comprising:
a first electrode;
a first quantum dot layer on the first electrode, the first quantum dot layer including a plurality of quantum dots; and
a second quantum dot layer including a plurality of quantum dots and being directly on the first quantum dot layer; and
a second electrode on the second quantum dot layer.

11. The die of claim 9, wherein the die is configured to be separated into a plurality of individual colloidal quantum dot devices.

12. A die comprising:
an integrated circuit;
a plurality of colloidal quantum dot devices on the integrated circuit;
an encapsulation layer on the plurality of colloidal quantum dot devices, the encapsulation layer comprising an ALD layer;
an epoxy layer on the plurality of colloidal quantum dot devices; and
a glass layer on the epoxy layer, wherein the ALD layer is on the glass layer.

13. A method of fabricating a colloidal quantum dot device, the method comprising:
providing an integrated circuit including a plurality of colloidal quantum dot structures thereon;
forming an encapsulation layer on the plurality of colloidal quantum dot structures, wherein forming the encapsulation layer comprises depositing the encapsulation layer using ALD and the ALD layer is formed directly on the plurality of colloidal quantum dot structures;
separating the plurality of colloidal quantum dot structures into individual colloidal quantum dot devices;
forming an epoxy layer on the ALD layer; and
forming a glass layer on the epoxy layer.

14. The method of claim 13, wherein the encapsulation layer comprises one or more of Al2O3, Zr2O3, ZnO, InO, SiO2, Si3N4, Hf2O3, TiO2, Ti3N4, SiO, Al2N3 and TaO2.

15. The method of claim 13, wherein the encapsulation layer is deposited at a temperature of from about 25° C. to about 150° C.

16. The method of claim 13, wherein the plurality of colloidal quantum dot structures each comprise one of a photodiode device and a photodetector detector device.

17. The method of claim 13, wherein forming the encapsulation layer comprises forming a plurality of alternating layers that together have the thickness of from about 0.5 nm to about 500 nm.

18. A method of fabricating a colloidal quantum dot device, the method comprising:
providing an integrated circuit including a plurality of colloidal quantum dot structures thereon;
forming an encapsulation layer on the plurality of colloidal quantum dot structures, wherein forming the encapsulation layer comprises depositing the encapsulation layer using ALD;
separating the plurality of colloidal quantum dot structures into individual colloidal quantum dot devices;
forming an epoxy layer on the plurality of colloidal quantum dot structures; and
forming a glass layer on the epoxy layer, wherein the ALD layer is formed on the glass layer.

* * * * *